(12) United States Patent
Takehara et al.

(10) Patent No.: US 8,067,814 B2
(45) Date of Patent: Nov. 29, 2011

(54) SEMICONDUCTOR DEVICE AND METHOD OF MANUFACTURING THE SAME

(75) Inventors: Hideki Takehara, Hyogo (JP); Kazuki Tateoka, Osaka (JP)

(73) Assignee: Panasonic Corporation, Osaka (JP)

( * ) Notice: Subject to any disclaimer, the term of this patent is extended or adjusted under 35 U.S.C. 154(b) by 161 days.

(21) Appl. No.: 12/128,010

(22) Filed: May 28, 2008

(65) Prior Publication Data

US 2008/0296735 A1 Dec. 4, 2008

(30) Foreign Application Priority Data

Jun. 1, 2007 (JP) .................................. 2007-146353
Mar. 7, 2008 (JP) .................................. 2008-057110

(51) Int. Cl.
*H01L 29/72* (2006.01)

(52) U.S. Cl. ........ 257/528; 257/531; 257/664; 257/690; 257/692; 257/698; 257/700; 257/737; 257/774

(58) Field of Classification Search .................. 257/528, 257/531, 664, 690, 692, 698, 700, 737, 774
See application file for complete search history.

(56) References Cited

U.S. PATENT DOCUMENTS

| | | | |
|---|---|---|---|
| 2004/0125579 A1* | 7/2004 | Konishi et al. | 361/783 |
| 2006/0040423 A1 | 2/2006 | Savastibuk et al. | 438/106 |
| 2007/0210866 A1* | 9/2007 | Sato et al. | 330/126 |
| 2008/0284018 A1* | 11/2008 | Chainer | 257/738 |
| 2009/0224318 A1* | 9/2009 | Hatori et al. | 257/339 |

FOREIGN PATENT DOCUMENTS

| | | |
|---|---|---|
| CN | 1536631 A | 10/2004 |
| JP | 2006-41401 | 2/2006 |

* cited by examiner

*Primary Examiner* — Edward Wojciechowicz
(74) *Attorney, Agent, or Firm* — Steptoe & Johnson LLP

(57) ABSTRACT

In the present invention, a first circuit pattern 3 composing a semiconductor element is formed on the front side of a substrate 1, a first insulating layer 2 is formed on the first circuit pattern 3, solder electrodes 5 for external connection are formed on the first insulating layer 2, a second insulating layer 6 is formed on the backside of the substrate 1, a second circuit pattern 7 is formed on the second insulating layer 6, through vias 8 are formed to connect the first circuit pattern 3 and the second circuit pattern 7, chip passive components 9 are placed on the second circuit pattern 7, and the backside of the substrate is integrally molded with epoxy resin 10 such that the epoxy resin 10 covers the chip passive components 9.

17 Claims, 11 Drawing Sheets

A : OUTPUT END OF DEVICE
L1 : POWER SUPPLY BIAS CIRCUIT LINE
L2 : SERIES INDUCTANCE COMPONENT OF OUTPUT MATCHING CIRCUIT

SEMICONDUCTOR DEVICE AND METHOD OF MANUFACTURING THE SAME

FIELD OF THE INVENTION

The present invention relates to a semiconductor device in which a circuit pattern and solder electrodes are formed on a substrate and the substrate is molded with resin such that the resin covers chip passive components placed on the circuit pattern, and a method of manufacturing the same.

BACKGROUND OF THE INVENTION

In recent years, particularly in the field of mobile communications mainly through cellular phones, the need for higher functionality has increased as well as the size reduction and slimming down of semiconductor devices for communications. Conventionally, a plurality of semiconductor elements have been used to configure a circuit on the substrate of a cellular phone. Thus there is a growing demand for advanced modules in which a plurality of semiconductor elements are stored in a single package and chip passive components such as a chip capacitor and a chip inductor are mounted in the package to provide a self-contained circuit and function in a device as circuit formation between the semiconductor elements.

For example, in PA modules for GSM cellular phones, a signal package includes a plurality of semiconductor elements corresponding to triple bands serving as usable frequency bands and includes a number of chip passive components such as a chip capacitor and a chip inductor for a circuit configuration between the elements, resulting in a complicated configuration (for example, see Japanese Patent Laid-Open No. 2006-041401).

A conventional semiconductor device will now be described in accordance with the accompanying drawings.

FIG. 9 is a sectional view showing the configuration of the conventional semiconductor device. In the conventional semiconductor device of FIG. 9, a circuit pattern 17 is formed on a resin substrate 91 which includes stacked thin plates of resin and has a diameter of 8 mm and a thickness of 1.5 mm. On the circuit pattern 17, a semiconductor element 93 and chip passive components 9 in 0603 size are mounted. Particularly, the chip passive components 9 are fixed on the resin substrate 91 by electrically connecting the chip passive components 9 to the circuit pattern 17 with solder 18. Further, the overall surface of the resin substrate 91 is molded and covered with epoxy resin 10, and solder electrodes 5 for external connection are formed on the underside of the resin substrate 91.

In the conventional semiconductor device of FIG. 9, the solder electrodes 5 for external connection are mounted on the underside of the resin substrate 91, the semiconductor element 93 and the chip passive components 9 are mounted on the top surface of the resin substrate 91, and the top surface of the resin substrate 91 is entirely molded with resin. This configuration increases both of the lateral dimensions and thickness dimensions of the semiconductor device, increasing the size of the overall device.

Further, the resin substrate 91 used as the substrate of the device increases the self weight of the overall semiconductor device and the deformations of the solder electrodes 5 for external connection. Thus a large spacing is necessary between the adjacent solder electrodes 5, increasing the size of the overall device.

Moreover, in this configuration, the semiconductor element 93 and the chip passive components 9 on the resin substrate 91 are only molded with resin. Thus it is not possible to obtain an electromagnetic shielding effect when the operating frequency is a high frequency of at least several hundreds MHz, causing a problem in obtaining the operational stability of the semiconductor device.

Another problem is how to dissipate heat from the semiconductor device when the heat is liberated during the operation of the semiconductor device as in a power semiconductor. Further, the use of the resin substrate 91 inevitably increases the manufacturing cost including the material cost.

Generally, in power amplifier circuits for amplifying high frequencies, it is necessary to set a large inductance value on a power supply line to prevent amplified power from leaking to a power supply side and perform high efficiency operations. An inductance component with such a large value formed on a surface of the semiconductor device causes a large chip size and inevitably increases the manufacturing cost including the material cost.

Further, when a plurality of inductance components are formed on a surface of a semiconductor device, the chip area is increased and it is difficult to obtain high-frequency isolation between the components, resulting in higher manufacturing cost and a deterioration of high frequency characteristics.

DISCLOSURE OF THE INVENTION

The present invention is devised to solve the problems of the prior art. An object of the present invention is to provide a semiconductor device and a method of manufacturing the same which can achieve low manufacturing cost while reducing the size and thickness of the device and improving the functionality of the peripheral circuits as well as the functionality of the device in the semiconductor device including chip passive components.

In order to solve the problems of the prior art, a semiconductor device of the present invention includes a first circuit pattern which is formed on the first major surface of a substrate having a single-layer structure of a thin plate and composes a semiconductor element, a second circuit pattern formed on a second major surface on the opposite side of the substrate from the first major surface, through vias formed between the first circuit pattern and the second circuit pattern to connect the circuit patterns through the substrate, solder electrodes formed for external connection on the first circuit pattern, and chip passive components placed on the second circuit pattern, wherein the second major surface is integrally molded with resin such that the resin covers the chip passive components.

Further, the first circuit pattern and the second circuit pattern are each formed to act as a micro-strip line having a continuous shape of one of a spiral, a meander, and a curve, and at least the ends of the first and second circuit patterns are electrically connected to each other via the through via.

Moreover, the first circuit pattern is formed to act as a micro-strip line having a continuous shape of one of a spiral, a meander, and a curve, the semiconductor device further includes a second land pattern formed at an opposite position from the first circuit pattern with the substrate disposed between the patterns, and the second land pattern is electrically connected to the ground potential of the first major surface via the through via.

Further, a semiconductor device of the present invention includes a first circuit pattern which is formed on the first major surface of a substrate having a single-layer structure of a thin plate and composes a semiconductor element, a second circuit pattern formed on a second major surface on the opposite side of the substrate from the first major surface, through vias formed between the first circuit pattern and the second circuit pattern to connect the circuit patterns through the substrate, solder electrodes formed for external connection on the first circuit pattern, and chip passive components placed on the second circuit pattern, wherein the first major surface is integrally molded with resin so as to partially expose the solder electrodes to the outside, and the second major surface is integrally molded with resin such that the resin covers the chip passive components.

Moreover, a semiconductor device of the present invention includes a first circuit pattern which is formed on the first major surface of a substrate having a single-layer structure of a thin plate and composes a semiconductor element, a second circuit pattern formed on a second major surface on the opposite side of the substrate from the first major surface, through vias formed between the first circuit pattern and the second circuit pattern to connect the circuit patterns through the substrate, solder electrodes formed for external connection on the first circuit pattern, chip passive components placed on the second circuit pattern, and metallic spacers placed on the second circuit pattern, wherein the second major surface is integrally molded with resin such that the resin covers the chip passive components and only the surfaces of the metallic spacers are exposed to the outside, and the semiconductor device further includes a metal thin film formed on a resin molding surface on the second major surface.

A method of manufacturing a semiconductor device according to the present invention includes the steps of: forming a first circuit pattern composing a semiconductor element, on the first major surface of a substrate made up of a wafer; forming a second circuit pattern on the second major surface of the substrate; forming through vias between the first circuit pattern and the second circuit pattern; forming solder electrodes for external connection on the first circuit pattern; placing chip passive components on the second circuit pattern; and integrally molding the second major surface with resin so as to cover the chip passive components.

Further, a method of manufacturing a semiconductor device according to the present invention includes the steps of: forming a first circuit pattern composing a semiconductor element, on the first major surface of a substrate made up of a wafer; forming a second insulating layer on a second major surface on the opposite side of the substrate from the first major surface; forming a second circuit pattern on the second insulting layer; forming through vias between the first circuit pattern and the second circuit pattern to connect the circuit patterns through the substrate; forming a first insulating layer on the first circuit pattern; forming solder electrodes for external connection on the first insulating layer; placing chip passive components on the second circuit pattern; and integrally molding the second major surface with resin so as to cover the chip passive components.

Moreover, a method of manufacturing a semiconductor device according to the present invention includes the steps of: forming a first circuit pattern composing a semiconductor element, on the first major surface of a substrate made up of a wafer; forming a second insulating layer on a second major surface on the opposite side of the substrate from the first major surface; forming a second circuit pattern on the second insulting layer; forming through vias between the first circuit pattern and the second circuit pattern to connect the circuit patterns through the substrate; forming a first insulating layer on the first circuit pattern; forming solder electrodes for external connection on the first insulating layer; integrally molding the first major surface with resin so as to partially expose the solder electrodes to the outside; placing chip passive components on the second circuit pattern; and integrally molding the second major surface with resin so as to cover the chip passive components.

Moreover, a method of manufacturing a semiconductor device according to the present invention includes the steps of: forming a first circuit pattern composing a semiconductor element, on the first major surface of a substrate made up of a wafer; forming a second insulating layer on a second major surface on the opposite side of the substrate from the first major surface; forming a second circuit pattern on the second insulting layer; forming through vias between the first circuit pattern and the second circuit pattern to connect the circuit patterns through the substrate; forming a first insulating layer on the first circuit pattern; forming solder electrodes for external connection on the first insulating layer; placing chip passive components and metallic spacers on the second circuit pattern; integrally molding the second major surface with resin so as to cover the chip passive components and the metallic spacers; polishing the second major surface until only the surfaces of the metallic spacers are exposed to the outside; and forming a metal thin film on the polished surface of the second major surface.

According to the present invention, the circuit pattern and the solder electrodes for external connection are formed on the front side of the substrate, the circuit pattern connected via the through via to the circuit pattern on the front side of the substrate is formed on the backside of the substrate, the chip passive components are placed on the circuit pattern, and the backside of the substrate is integrally molded with resin such that the resin covers the chip passive components, wherein the size of the semiconductor device is substantially the same as the size of the semiconductor element and the thickness of the semiconductor device can be greatly reduced as compared with a semiconductor device using a conventional resin substrate.

Since the solder electrodes on the front side of the substrate are molded with resin, there is no possibility that the solder electrodes deformed by the self weights would cause a short circuit between the adjacent solder electrodes, thereby reducing a spacing between the adjacent solder electrodes.

Further, the metal thin film is formed on the resin after the substrate is molded with the resin such that only the surfaces of the metallic spacers are exposed. Thus by connecting the ground potential of the semiconductor device and the metallic spacers in an electric circuit, the metal thin film formed on the surface of the resin has the same potential as the ground potential of the semiconductor device, so that it is possible to obtain an electromagnetic shielding effect when the operating frequency is at least several hundreds MHz and obtain the operational stability of the semiconductor device. Furthermore, since both surfaces of the substrate are molded with resin, it is also possible to obtain a secondary effect of improving the transverse strength of the substrate.

Moreover, by using the solder electrodes and copper blocks which are formed on the surfaces of the substrate, heat generated on the substrate is dissipated also from the metal thin film formed on the resin molding surface, through the copper blocks. Thus it is possible to improve heat dissipation as compared with a conventional semiconductor device.

Since a resin substrate is not used, it is possible to suppress the material cost and simplify the process, thereby suppressing the manufacturing cost.

With this configuration, it is possible to achieve low manufacturing cost while reducing the size and thickness of the device and improving the functionality of the peripheral circuits as well as the functionality of the device, in the semiconductor device including the chip passive components.

Further, the first circuit pattern having the function of the micro-strip line having a continuous shape of one of a spiral, a meander, and a curve on the first major surface and the second circuit pattern having the function of the micro-strip line having a continuous shape of one of a spiral, a meander, and a curve on the second major surface are electrically connected to each other via the through via. Thus the first and second combined circuit patterns form an inductance component, and the area of the first circuit pattern on the first major surface can be reduced by optimizing first and second inductance components, thereby reducing the size and manufacturing cost of the semiconductor device.

For example, in the case where a third circuit pattern is formed at a different position on the first major surface and a fourth circuit pattern is formed at a different position on the second major surface in a similar manner to the first circuit pattern formed on the first major surface and the second circuit pattern formed on the second major surface, the first circuit pattern formed on the first major surface and the second circuit pattern formed on the second major surface are connected to each other via the through via, the third circuit pattern formed at the different position on the first major surface and the second circuit pattern formed on the second major surface are connected to each other via the through via, and the fourth circuit pattern formed at the different position on the second major surface and the third circuit pattern formed at the different position on the first major surface are connected to each other via the through via, so that the circuit patterns on the first major surface and the second major surface can be extended as a single circuit pattern through the through via. Thus it is possible to easily form a large inductance which cannot be formed on one surface in the prior art, without increasing the size of the semiconductor device.

Further, the first circuit pattern and the second circuit pattern are electrically connected to each other via the through via at the shortest distance. The first circuit pattern has the function of the micro-strip line having a continuous shape of one of a spiral, a meander, and a curve on the first major surface, and the second circuit pattern is formed at the opposite position on the second major surface from the first circuit pattern with the substrate disposed between the circuit patterns, and has the function of the micro-strip line having a continuous shape of one of a spiral, a meander, and a curve. With this configuration, the first and second combined circuit patterns form an inductance component with high accuracy, and the area of the first circuit pattern on the first major surface can be reduced by optimizing first and second inductance components, thereby reducing the size and manufacturing cost of the semiconductor device.

The first spiral circuit pattern and the second spiral circuit pattern are wound in the same direction or in the opposite directions. Thus when the circuit patterns are wound in the same direction and the signals travel in the same direction, the directions of magnetic fields are aligned and combined to obtain a great inductance effect. On the other hand, when the circuit patterns are wound in the opposite directions and the signals travel in the opposite directions, the isolations of the circuit patterns are increased and the circuit patterns can be caused to act as separate high-frequency elements.

Moreover, the first circuit pattern is formed which has the function of the micro-strip line having a continuous shape of one of a spiral, a meander, and a curve on the first major surface, a second land is formed at an opposite position from the first circuit pattern with the substrate disposed between the patterns, and the second land is connected to the ground potential of the circuit pattern on the first major surface via the through via of the substrate. With this configuration, the surface where the first circuit pattern is formed and the surface where the second land pattern is formed can be isolated from each other, thereby achieving an effective solution to undesired oscillation (for example, self oscillation and parasitic oscillation).

The first circuit pattern is formed which has the function of the micro-strip line having a continuous shape of one of a spiral, a meander, and a curve on the first major surface, the second land is formed at the opposite position from the first circuit pattern with the substrate disposed between the patterns and has an area as large as or larger than the first circuit pattern, and the second land is connected to the ground potential of the circuit pattern on the first major surface via the through via of the substrate. With this configuration, the isolations of the patterns can be maximized by optimizing the area of the second land pattern, thereby achieving an effective solution to undesired oscillation (for example, self oscillation and parasitic oscillation).

Since the substrate is one of a silicon wafer and a GaAs (gallium arsenide) wafer, the substrate has a high dielectric constant of at least 10 and the length of the micro-strip line can be shortened in a high-frequency region, thereby reducing the size and manufacturing cost of the semiconductor device.

DESCRIPTION OF THE EMBODIMENTS

A semiconductor device and a method of manufacturing the same according to embodiments of the present invention will now be specifically described with reference to the accompanying drawings.

First Embodiment

The following will describe a semiconductor device and a method of manufacturing the same according to a first embodiment of the present invention.

Figure 1:
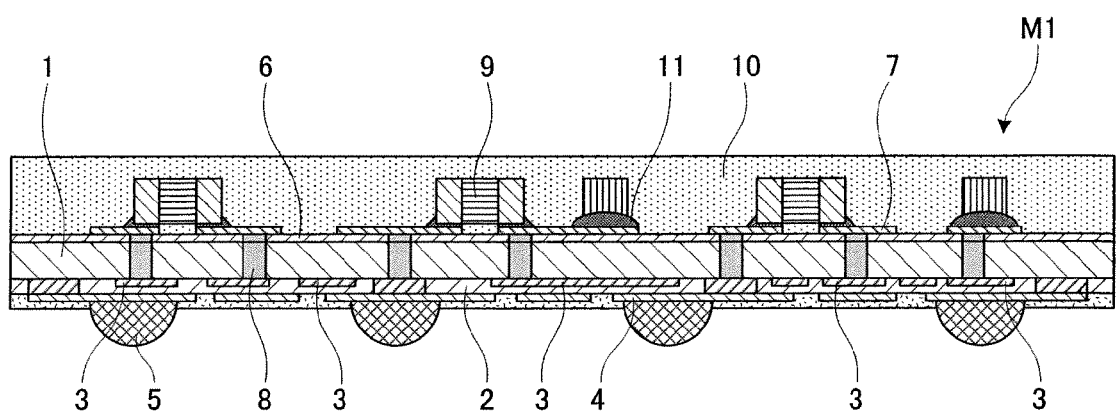
FIG. 1 is a sectional view showing the configuration of a semiconductor device according to a first embodiment of the present invention.

FIG. 1 is a sectional view showing the configuration of the semiconductor device according to the first embodiment. The semiconductor device of the sectional view is a power amplifier module for W-CDMA of 800 MHz to 2 GHz. In the semiconductor device of FIG. 1, a power amplifier module M1 is 5 mm high by 2.5 mm wide and is 1.1 mm thick. A substrate 1 is a GaAs (gallium arsenide) wafer. On the wafer surface layer (the lower part of FIG. 1) of the substrate 1, a semiconductor element made up of a power amplifier circuit pattern 3 is formed as a first circuit pattern. The substrate 1 is 0.25 mm thick. On the power amplifier circuit pattern 3, a first insulating layer 2 is formed which is made of epoxy resin and is 0.1 mm thick. Further, copper rewiring 4 and hemispherical solder electrodes 5 for external connection are formed thereon.

Conventionally, Sn—Pb eutectic solder has been used for the solder electrodes 5. In recent years, Sn—Ag solder and Sn—Ag—Cu solder have been used for environmental measures because these solders do not contain Pb. The solder electrodes 5 are 300 μm in diameter and 200 μm in height.

On the wafer backside of the substrate 1 (the upper part of FIG. 1), a second insulating layer 6 is formed which is made of epoxy resin and is 0.1 mm thick, and a second circuit pattern 7 is formed thereon by copper rewiring. Further, through vias 8 are formed at any positions on the GaAs wafer serving as the substrate 1 to electrically connect the power amplifier circuit pattern 3 and the second circuit pattern 7 on the backside.

The through vias 8 are mainly formed in the ground pattern of the power amplifier circuit pattern 3 on the GaAs wafer substrate 1, and metal thin films (not shown) are formed on the inner walls of the vias by evaporation. The through vias 8 have an inside diameter of 80 μm and the number of through vias 8 in the GaAs wafer substrate 1 is 12.

On the second circuit pattern 7, chip capacitors 9 in 0402 size are fixed with conductive adhesive 11 and are integrally molded with epoxy resin 10. The chip capacitors 9 can be fixed also by Sn—Ag—Cu and Sn—Sb solder materials on the second circuit pattern 7 with the same effect. The epoxy resin for resin molding is 0.4 mm thick and is formed by printing encapsulation.

Figure 2A:
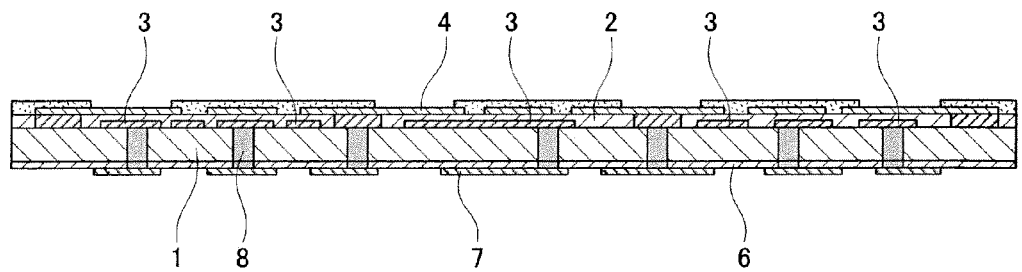
FIG. 2A is an explanatory drawing schematically showing step (a) in a method of manufacturing the semiconductor device according to the first embodiment.
Figure 2B:
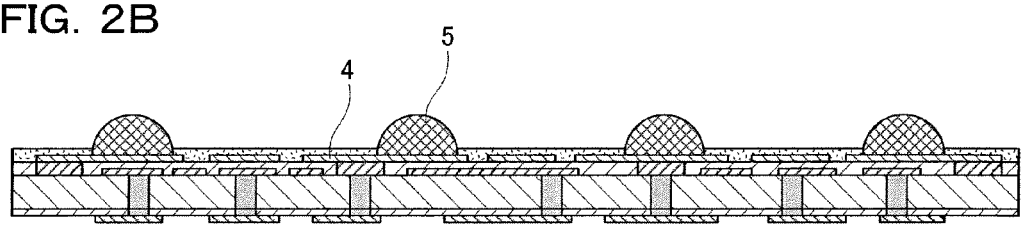
FIG. 2B is an explanatory drawing schematically showing step (b) in the method of manufacturing the semiconductor device according to the first embodiment.
Figure 2C:
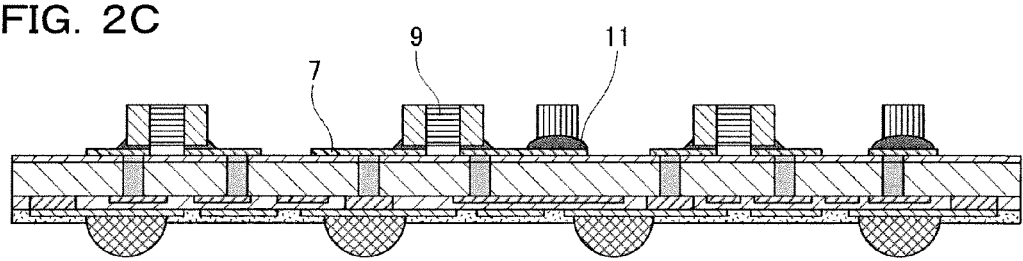
FIG. 2C is an explanatory drawing schematically showing step (c) in the method of manufacturing the semiconductor device according to the first embodiment.
Figure 2D:
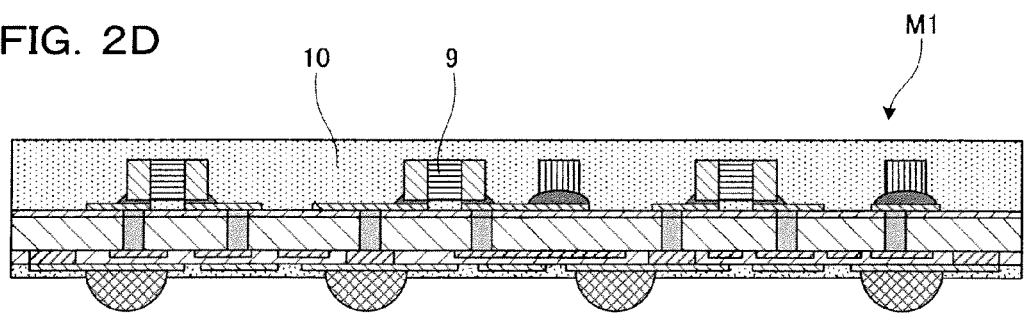
FIG. 2D is an explanatory drawing schematically showing step (d) in the method of manufacturing the semiconductor device according to the first embodiment.

FIGS. 2A to 2D are explanatory drawings schematically showing steps in the method of manufacturing the semiconductor device according to the first embodiment. As shown in FIG. 2A (step (a)), the first insulating layer 2 and the second insulating layer 6 are formed on the respective surfaces of the GaAs wafer substrate 1 and then the copper rewiring 4 is provided. After that, as shown in FIG. 2B (step (b)), Sn—Ag—Cu solder balls are placed at predetermined positions on the copper rewiring 4 and the solder electrodes 5 are formed by reflowing. Thereafter, as shown in FIG. 2C (step (c)), chip passive components such as the chip capacitors 9 are fixed on the second circuit pattern 7 with the conductive adhesive 11, and then as shown in FIG. 2D (step (d)), the GaAs wafer substrate 1 is molded with the liquid epoxy resin 10 from the above of the chip capacitors 9 by printing.

When the chip capacitors 9 are fixed using solder materials, in order to avoid the remelting of the solder electrodes 5, the chip capacitors 9 are solder mounted on the second circuit pattern 7 and the GaAs wafer substrate 1 is molded with the liquid epoxy resin 10 before the solder balls are mounted on the surface of the GaAs wafer substrate 1 and the solder electrodes 5 are formed by reflowing.

In this case, since the electrodes are formed by reflow heating after the resin molding, low-melting solder such as Sn—Bi solder can be used for the solder electrodes 5 in addition to Sn—Ag solder and Sn—Ag—Cu solder. Further, unlike the prior art, a material for a resin substrate is not necessary and batch processing can be performed on each of the GaAs wafer substrates 1 on which the multiple power amplifier modules M1 are disposed, thereby reducing the manufacturing cost.

Moreover, the size of the semiconductor device can be substantially the same as the size of the semiconductor element made up of the first circuit pattern 3 and thus a greater size reduction can be achieved as compared with a semiconductor device using a conventional resin substrate. Further, since the batch processing can be performed on the GaAs wafer substrate on which the multiple power amplifier modules M1 are disposed, the manufacturing cost can be reduced.

Second Embodiment

The following will describe a semiconductor device and a method of manufacturing the same according to a second embodiment of the present invention.

Figure 3:
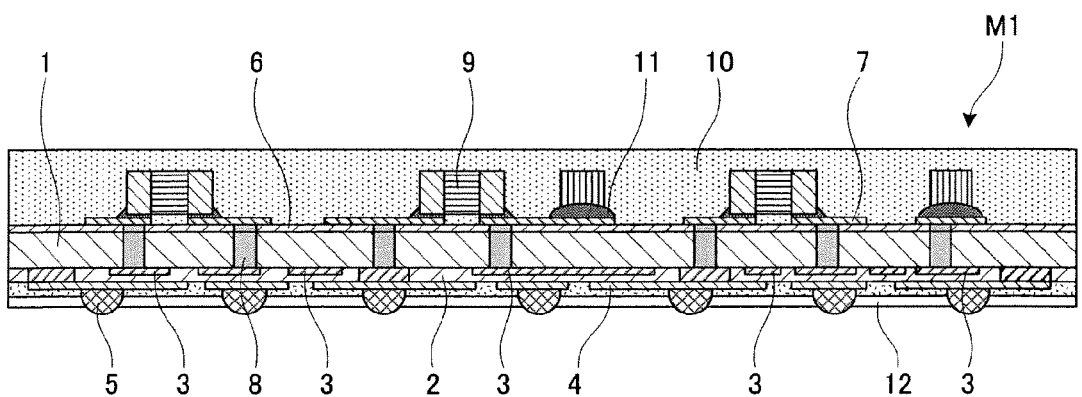
FIG. 3 is a sectional view showing the configuration of a semiconductor device according to a second embodiment of the present invention.

FIG. 3 is a sectional view schematically showing the configuration of the semiconductor device according to the second embodiment. In the semiconductor device of FIG. 3, a power amplifier module M1 is 5 mm high by 2.5 mm wide and is 1.1 mm thick. A substrate 1 is a GaAs wafer. On the wafer surface layer (the lower part of FIG. 3) of the substrate 1, a semiconductor element made up of a power amplifier circuit pattern 3 is formed as a first circuit pattern. The substrate 1 is 0.25 mm thick. On the power amplifier circuit pattern 3, a first insulating layer 2 is formed which is made of epoxy resin and is 100 μm thick. Further, copper rewiring 4 and solder electrodes 5 for external connection are formed thereon.

The solder electrodes 5 are formed using hemispherical Sn—Ag solder and Sn—Ag—Cu solder. The solder electrodes 5 are 200 μm in diameter and 180 μm in height, and are molded with second epoxy resin 12 so as to be only partially exposed from the epoxy resin 12. The spacing between the solder electrodes 5 is 600 μm and the thickness of the second epoxy resin 12 is 150 μm.

On the backside of the GaAs wafer substrate 1 (the upper part of FIG. 3), a second insulating layer 6 is formed which is made of epoxy resin and is 100 μm thick, and a second circuit pattern 7 is formed thereon by copper rewiring. Further, through vias 8 are formed at any positions on the GaAs wafer substrate 1 to electrically connect the power amplifier circuit pattern 3 and the second circuit pattern 7 on the backside.

The through vias 8 are mainly formed in the ground pattern of the power amplifier circuit pattern 3 on the GaAs wafer substrate 1, and metal thin films (not shown) are formed on the inner walls of the vias by evaporation. The through vias 8 have an inside diameter of 80 μm and the number of through vias 8 in the substrate 1 is 12.

On the second circuit pattern 7, chip capacitors 9 in 0402 size are fixed with conductive adhesive 11 and are integrally molded with epoxy resin 10. The chip capacitors 9 can be fixed also by Sn—Ag—Cu and Sn—Sb solder materials on the second circuit pattern 7 with the same effect. The epoxy resin 10 for resin molding is 0.4 mm thick and is formed by printing encapsulation.

Figure 4A:
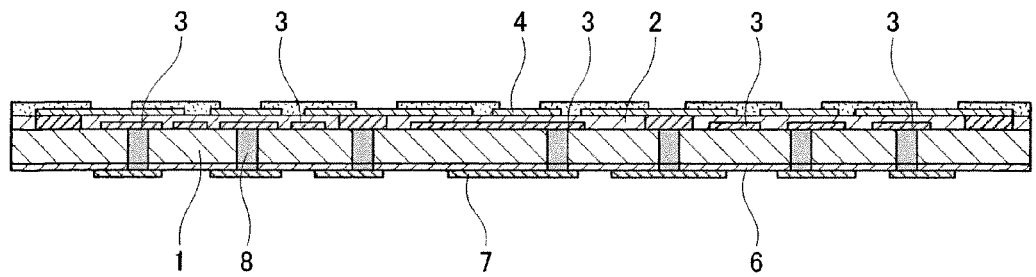
FIG. 4A is an explanatory drawing schematically showing step (a) in a method of manufacturing the semiconductor device according to the second embodiment.
Figure 4B:
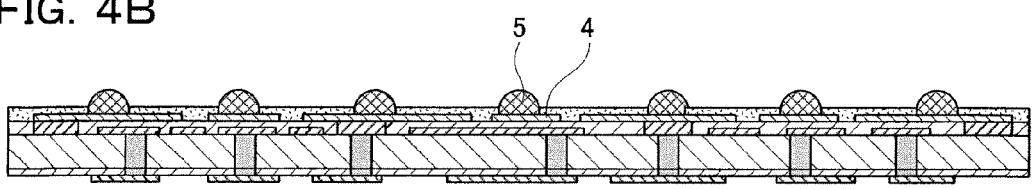
FIG. 4B is an explanatory drawing schematically showing step (b) in the method of manufacturing the semiconductor device according to the second embodiment.

FIGS. 4A to 4E are explanatory drawings schematically showing steps in the method of manufacturing the semiconductor device according to the second embodiment. As shown in FIG. 4A (step (a)), the first insulating layer 2 and the second insulating layer 6 are formed on the respective surfaces of the GaAs wafer substrate 1 and then the copper rewiring 4 is provided. After that, as shown in FIG. 4B (step (b)), Sn—Ag—Cu solder balls are placed at predetermined positions on the copper rewiring 4 and the solder electrodes 5 are formed by reflowing. The solder electrodes 5 are 200 μm in diameter and 180 μm in height.

Figure 4C:
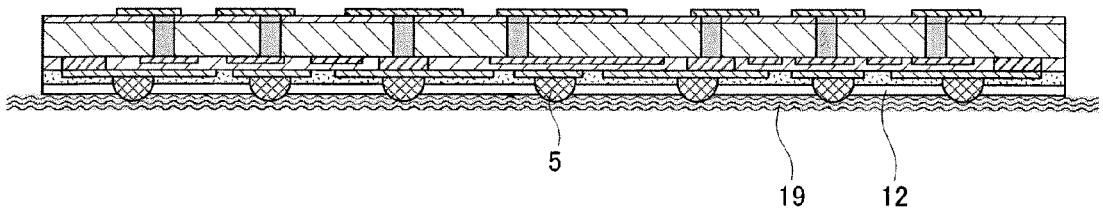
FIG. 4C is an explanatory drawing schematically showing step (c) in the method of manufacturing the semiconductor device according to the second embodiment.

Further, as shown in FIG. 4C (step (c)), the solder electrodes 5 are molded with the liquid second epoxy resin 12 by printing encapsulation so as to be only partially exposed from the second epoxy resin 12. At this moment, a heat-resistant film 19 such as a polyimide film and a Teflon (registered trademark) film is placed under the solder electrodes 5 to prevent the epoxy resin 12 from reaching the ends of the solder electrodes 5. Only adhesion and elasticity of film characteristics are necessary during heating. The heat-resistant film 19 may be a film falling off by itself when the resin is thermally cured.

Figure 4D:
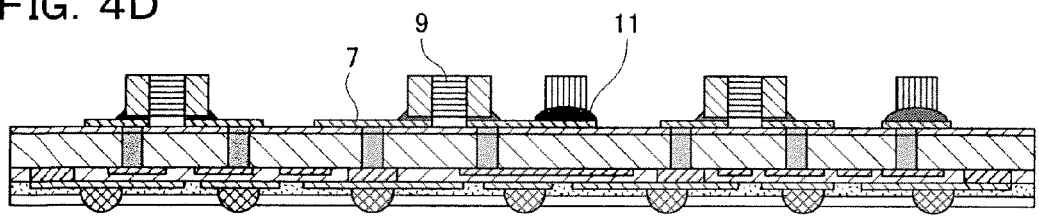
FIG. 4D is an explanatory drawing schematically showing step (d) in the method of manufacturing the semiconductor device according to the second embodiment.
Figure 4E:
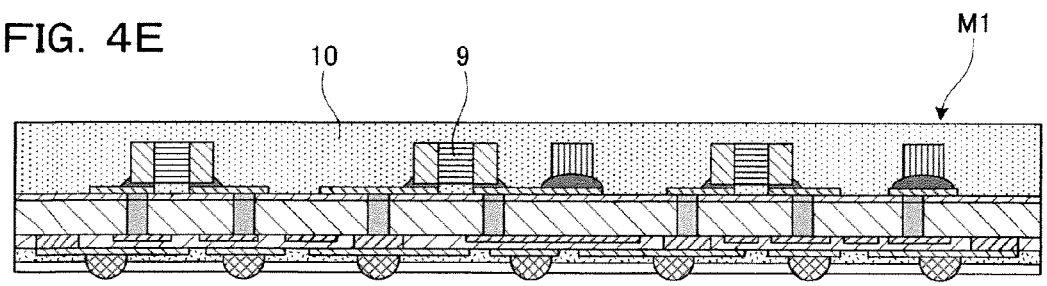
FIG. 4E is an explanatory drawing schematically showing step (e) in the method of manufacturing the semiconductor device according to the second embodiment.

Thereafter, as shown in FIG. 4D (step (d)), chip passive components such as the chip capacitors 9 are fixed on the second circuit pattern 7 with conductive adhesive 11. After that, as shown in FIG. 4E (step (e)), the GaAs wafer substrate 1 is molded with the liquid epoxy resin 10 from the above of the chip capacitors 9 by printing.

When the chip capacitors 9 are fixed using solder materials, in order to avoid the remelting of the solder electrodes 5, the chip capacitors 9 are solder mounted on the second circuit pattern 7 and the GaAs wafer substrate 1 is molded with the liquid resin before the solder balls are mounted on the surface of the GaAs wafer substrate 1 and the solder electrodes 5 are formed by reflowing. In this case, since the electrodes are formed by reflow heating after the resin molding, low-melting solder such as Sn—Bi solder can be used as the material of the solder electrodes 5 in addition to Sn—Ag solder and Sn—Ag—Cu solder.

According to the present embodiment, since the solder electrodes 5 on the surface of the substrate 1 are molded with resin, the solder electrodes 5 deformed by the self weights do not cause a problem such as a short circuit between the adjacent solder electrodes 5, so that the spacing between the adjacent solder electrodes 5 can be reduced in addition to the effect of the first embodiment.

When reducing the diameters of the solder electrodes 5 and the thickness of the molding epoxy resin 12 such that the solder electrodes 5 are 100 μm high and the molding epoxy resin 12 is 80 μm thick, the spacing between the solder electrodes 5 can be reduced to 200 μm.

Since both surfaces of the substrate 1 are molded with resin, it is also possible to obtain a secondary effect of improving the transverse strength of the substrate by about 30% as compared with the first embodiment.

Third Embodiment

The following will describe a semiconductor device and a method of manufacturing the same according to a third embodiment of the present invention.

Figure 5:
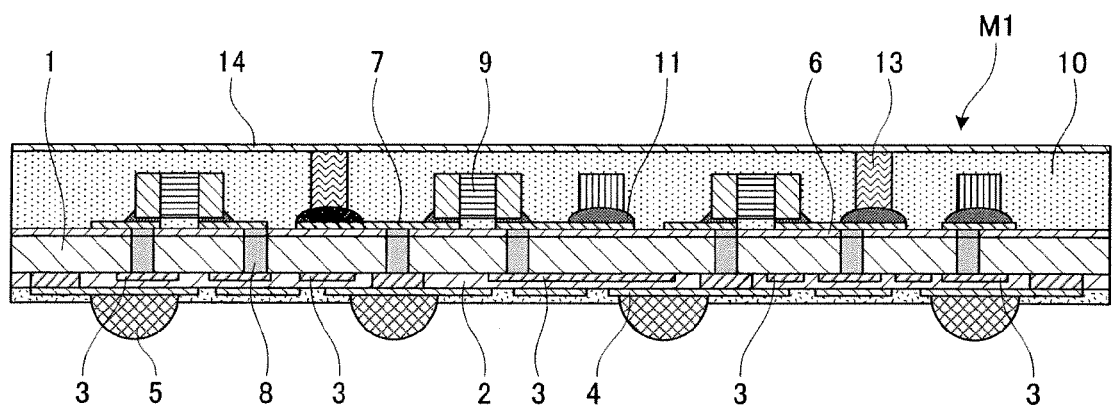
FIG. 5 is a sectional view showing the configuration of a semiconductor device according to a third embodiment of the present invention.

FIG. 5 is a sectional view schematically showing the configuration of the semiconductor device according to the third embodiment of the present invention. In the semiconductor device of FIG. 5, a power amplifier module M1 is 5 mm high by 2.5 mm wide and is 1.2 mm thick. A substrate 1 is a GaAs wafer. On the wafer surface layer (the lower part of FIG. 5) of the substrate 1, a semiconductor element made up of a power amplifier circuit pattern 3 is formed as a first circuit pattern. The substrate 1 is 0.25 mm thick. On the power amplifier circuit pattern 3, a first insulating layer 2 is formed which is made of epoxy resin and is 0.1 mm thick. Further, copper rewiring 4 and hemispherical solder electrodes 5 for external connection are formed thereon.

Conventionally, Sn—Pb eutectic solder has been used for the solder electrodes 5. In recent years, Sn—Ag solder and Sn—Ag—Cu solder have been used for environmental measures because these solders do not contain Pb. The solder electrodes 5 are 300 μm in diameter and 200 μm in height. On the backside of the GaAs wafer substrate 1 (the upper part of FIG. 5), a second insulating layer 6 is formed which is made of epoxy resin and is 0.1 mm thick, and a second circuit pattern 7 is formed thereon by copper rewiring. Further, through vias 8 are formed at any positions on the GaAs wafer substrate 1 to electrically connect the power amplifier circuit pattern 3 and the second circuit pattern 7 on the backside.

The through vias 8 are mainly formed in the ground pattern of the power amplifier circuit pattern 3 on the GaAs wafer substrate 1, and metal thin films (not shown) are formed on the inner walls of the vias by evaporation. The vias have an inside diameter of 80 μm and the number of through vias in the GaAs wafer substrate 1 is 12.

On the second circuit pattern 7, chip capacitors 9 in 0402 size and metallic spacers 13 are fixed with conductive adhesive 11 and are molded with epoxy resin 10 such that the metallic spacers 13 are partially exposed from the epoxy resin 10. The metallic spacers 13 are made of copper and are 0.3 mm in diameter and 0.5 mm in height. Further, the metallic spacers 13 are attached to the ground pattern of the second circuit pattern 7.

The chip capacitors 9 and the metallic spacers 13 can be fixed also by Sn—Ag—Cu and Sn—Sb solder materials on the second circuit pattern 7 with the same effect.

Figure 6A:
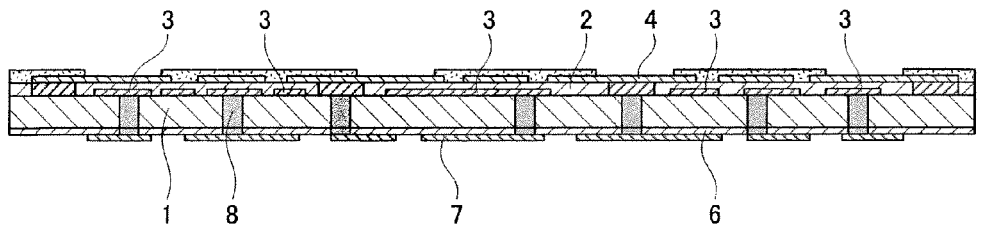
FIG. 6A is an explanatory drawing schematically showing step (a) in a method of manufacturing the semiconductor device according to the third embodiment.
Figure 6B:
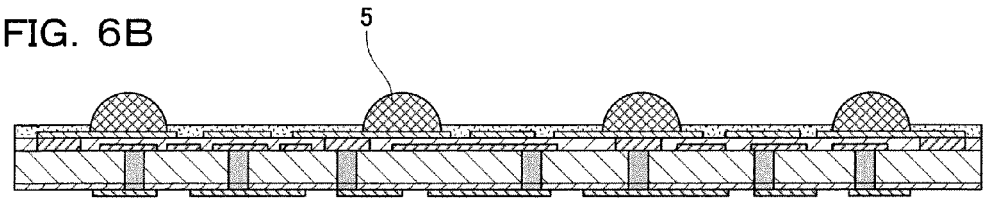
FIG. 6B is an explanatory drawing schematically showing step (b) in the method of manufacturing the semiconductor device according to the third embodiment.
Figure 6C:
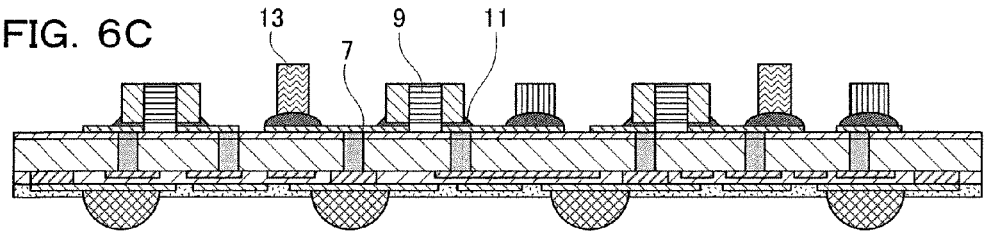
FIG. 6C is an explanatory drawing schematically showing step (c) in the method of manufacturing the semiconductor device according to the third embodiment.
Figure 6D:
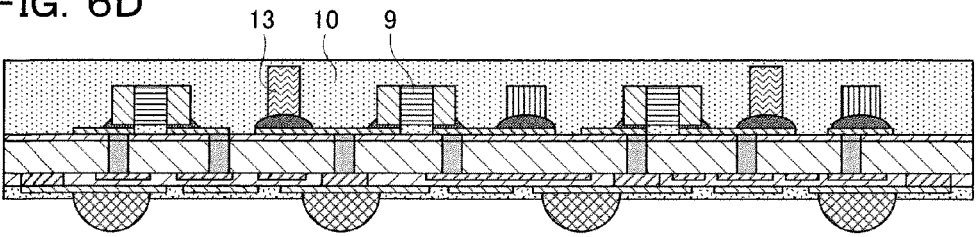
FIG. 6D is an explanatory drawing schematically showing step (d) in the method of manufacturing the semiconductor device according to the third embodiment.
Figure 6E:
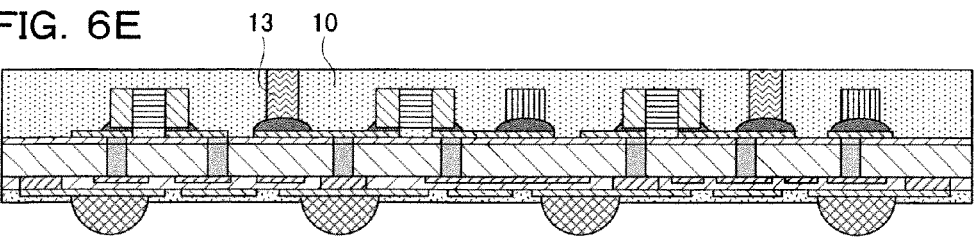
FIG. 6E is an explanatory drawing schematically showing step (e) in the method of manufacturing the semiconductor device according to the third embodiment.

FIGS. 6A to 6F are explanatory drawings schematically showing steps in the method of manufacturing the semiconductor device according to the third embodiment. As shown in FIG. 6A (step (a)) to FIG. 6C (step (c)), the substrate 1 is a GaAs wafer, the solder electrodes 5 are formed on the surface of the GaAs wafer substrate 1, and the chip capacitors 9 and the metallic spacers 13 are fixed on the second circuit pattern 7 on the backside of the GaAs wafer substrate 1 with the conductive adhesive 11. As shown in FIG. 6D (step (d)), the molding material is the epoxy resin 10 and the chip capacitors 9 and the metallic spacers 13 are completely molded by printing encapsulation. After that, as shown in FIG. 6E (step (e)), the surface of the epoxy resin 10 acting as molding resin is polished until the surfaces of the metallic spacers 13 are exposed.

Figure 6F:
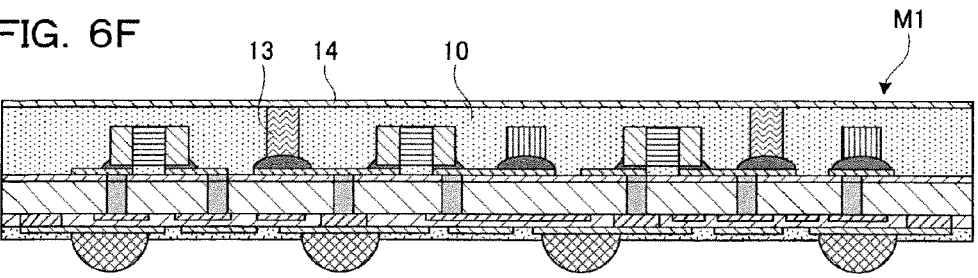
FIG. 6F is an explanatory drawing schematically showing step (f) in the method of manufacturing the semiconductor device according to the third embodiment.

Further, as shown in FIG. 6F (step (f)), a metal thin film 14 is formed on the surface of the epoxy resin 10 by evaporation or plating and is electrically connected to the exposed portions of the metallic spacers 13. In the case of evaporation, the metal thin film 14 on the surface of the epoxy resin 10 includes metal layers of Cu, Ni, and Au in this order from the resin side. Plating includes Cu plating, Ni plating, and Au plating. When the metal thin film 14 is made up of three evaporation layers, the thickness is about 1 μm. When the metal thin film 14 including three layers is formed by plating, the thickness is about 4 μm.

According to the present embodiment, the metallic spacers 13 on the second circuit pattern 7 are connected to the metal thin film 14 formed on the surface of the epoxy resin 10 for molding. Thus by connecting the ground potential of the semiconductor device and the metallic spacers 13 in an electric circuit, the metal thin film 14 formed on the surface of the resin has the same potential as the ground potential of the semiconductor device, so that it is possible to obtain an electromagnetic shielding effect when the operating frequency is at least several hundreds MHz and obtain the operational stability of the semiconductor device.

Fourth Embodiment

The following will describe a semiconductor device and a method of manufacturing the same according to a fourth embodiment of the present invention.

Figure 7:
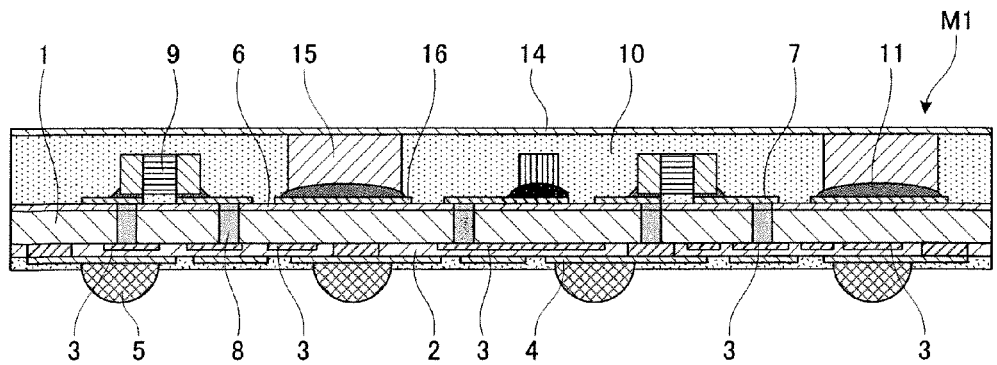
FIG. 7 is a sectional view showing the configuration of a semiconductor device according to a fourth embodiment of the present invention.

FIG. 7 is a sectional view schematically showing the configuration of the semiconductor device according to the fourth embodiment of the present invention. In the semiconductor device of FIG. 7, copper blocks 15 are used instead of the metallic spacers 13 of the semiconductor device of the third embodiment, and heat from a substrate 1 is dissipated through the copper blocks 15 from a metal thin film 14 formed on a resin molding surface.

The copper blocks 15 are 0.8 mm in diameter and 0.5 mm in height and are attached to the backside of a region having the highest heating value in a power amplifier circuit pattern 3 of the GaAs wafer substrate 1.

The metallic spacers 13 are attached to the ground pattern of the second circuit pattern 7, whereas the copper blocks 15 for dissipating heat are larger in thermal capacity and sectional area than the metallic spacers 13 and are attached to dedicated patterns 16 on the backside of the region having the highest heating value in the power amplifier circuit pattern 3 of the GaAs wafer substrate 1.

Figure 8:
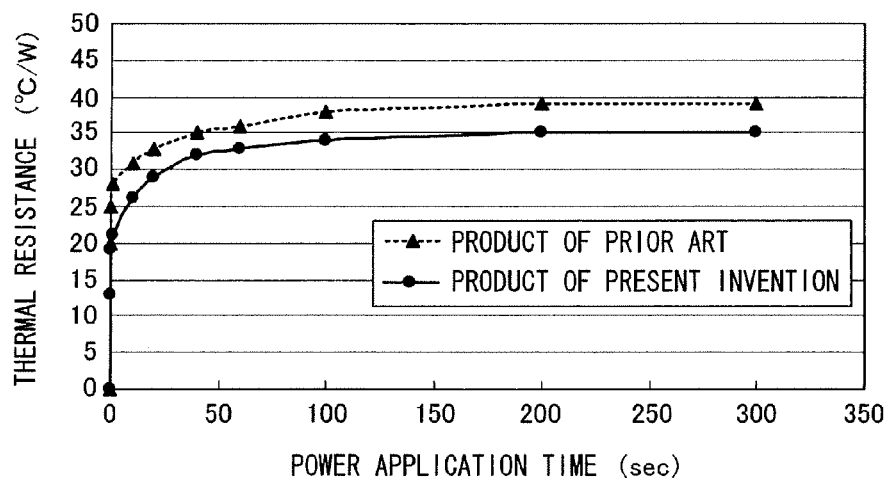
FIG. 8 is an explanatory drawing showing the comparison of thermal resistances between the semiconductor device of the fourth embodiment and a conventional example.
Figure 9:
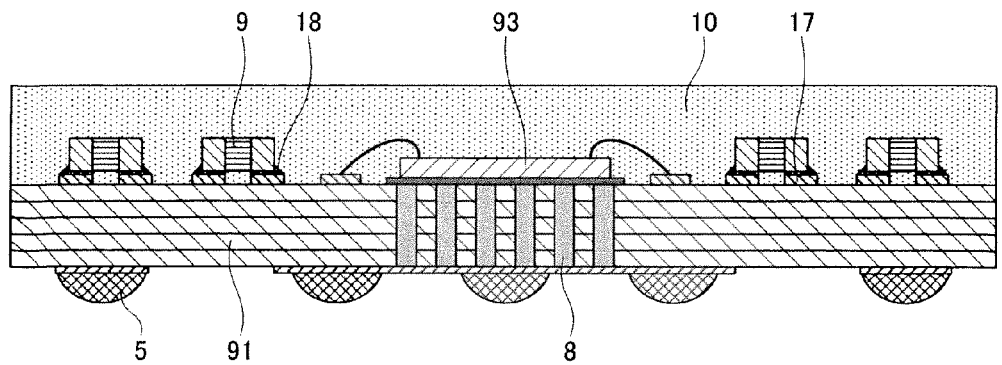
FIG. 9 is a sectional view showing the configuration of a conventional semiconductor device.

FIG. 8 shows an example of the thermal resistance of a power amplifier module using a resin substrate having a conventional configuration and the thermal resistance of a power amplifier module of the fourth embodiment. As shown in FIG. 8, even the small configuration of the fourth embodiment can improve the heat dissipation characteristics by about 10% at the maximum as compared with the conventional resin substrate because the heat of the GaAs wafer substrate 1 is dissipated from a mounting board (not shown) and the metal thin film 14 formed on the epoxy resin 10, through solder electrodes 5 and the copper blocks 15.

Fifth Embodiment

The following will describe a semiconductor device according to a fifth embodiment of the present invention.

Figure 10:
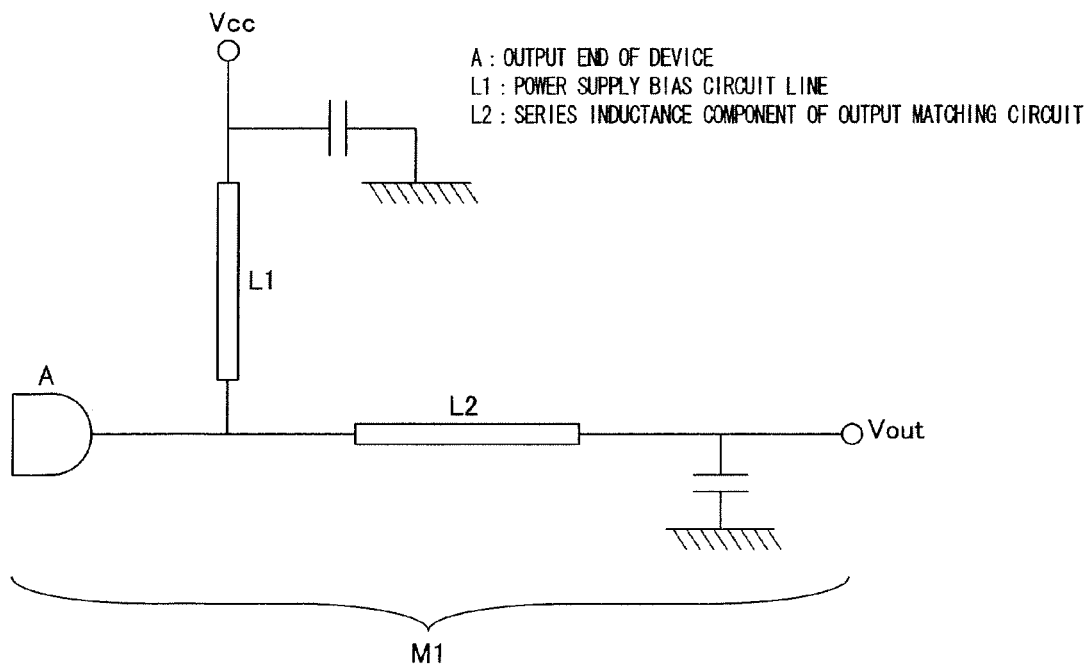
FIG. 10 is a circuit diagram showing the basic configuration of a power amplifier module.
Figure 11:
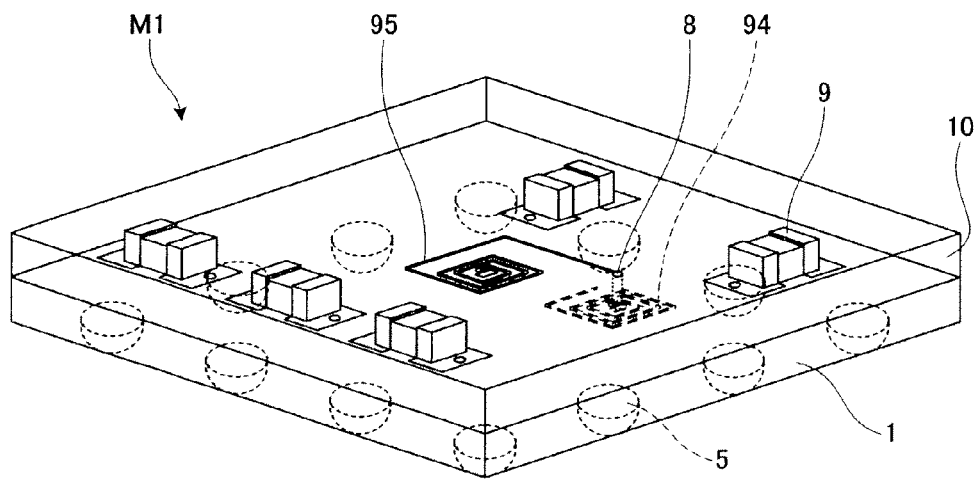
FIG. 11 is a perspective view showing the internal configuration of a semiconductor device according to a fifth embodiment of the present invention.
Figure 12:
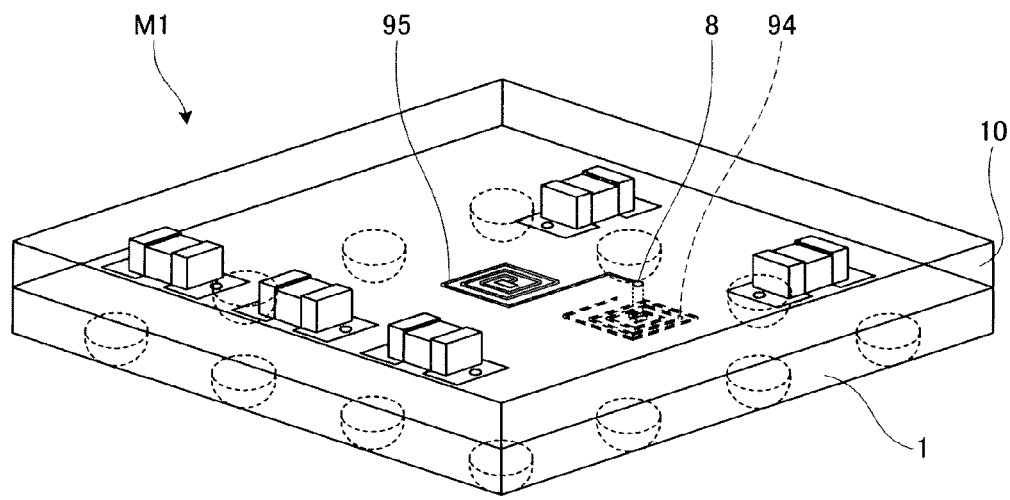
FIG. 12 is a perspective view showing another internal configuration of the semiconductor device according to the fifth embodiment.
Figure 13:
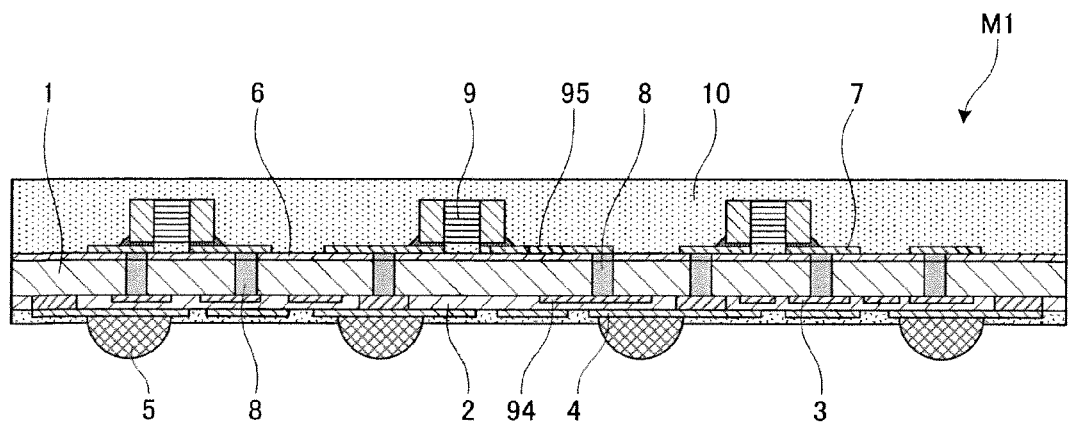
FIG. 13 is a sectional view showing the internal configuration of the semiconductor device according to the fifth embodiment.

FIG. 10 is a basic circuit diagram of a power amplifier module configured as the semiconductor device. FIGS. 11, 12, and 13 are perspective views and a sectional view showing the configuration of the semiconductor device according to the fifth embodiment. A power amplifier module M1 shown in FIG. 10 is configured as the semiconductor device shown in FIGS. 11, 12 and 13. The semiconductor device (power amplifier module M1) is 5 mm high by 2.5 mm wide and is 1.1 mm thick.

In FIGS. 11, 12 and 13, a substrate 1 is a GaAs wafer. On the wafer surface layer (the lower part of FIG. 11) of the substrate 1, a semiconductor element made up of a power amplifier circuit pattern is formed as a circuit pattern. In the power amplifier circuit, a first circuit pattern (L1) 94 is formed which is made up of a micro-strip line having a continuous shape of one of a spiral, a meander, and a curve and has an inductance function.

FIGS. 11, 12 and 13 show continuous spirals which are wound four times with pattern width/spacing=10 μm/10 μm and are 0.2 mm in diameter. The GaAs substrate 1 is 0.25 mm thick. On the power amplifier circuit, a first insulating layer 2 is formed which is made of epoxy resin and is 100 μm thick. Further, copper rewiring 4 and solder electrodes 5 for external connection are formed on the first insulating layer 2. At the center of the spiral, a through via 8 is formed in the GaAs substrate 1 and is connected to the first spiral circuit pattern (L1) 94. Further, on the backside of the GaAs substrate 1, a second insulating layer 6 is formed which is made of epoxy resin and is 100 μm thick. Moreover, a second circuit pattern (L2) 95 is formed thereon by the copper rewiring 4.

The second circuit pattern (L2) 95 shaped like a continuous spiral having the same area as the first circuit pattern (L1) 94 is formed at any position and is connected, at the pattern end of the second circuit pattern (L2) 95, to the circuit pattern extending from the through via provided in the GaAs substrate 1. In the example of FIG. 11, the first spiral circuit pattern (L1) 94 and the second spiral circuit pattern (L2) 95 are both wound from the outside in the same counterclockwise direction. In the example of FIG. 12, the second spiral circuit pattern (L2) 95 is wound from the outside in a clockwise direction, that is, in the opposite direction from the first spiral circuit pattern (L1) 94 wound from the outside in the counterclockwise direction.

In the present embodiment, the first circuit pattern (L1) 94 and the second circuit pattern (L2) 95 are illustrated as continuous spirals. The same effect can be obtained by, for example, an inductance formed by a micro-strip line shaped like one of a meander and a curve.

According to the present embodiment, the first circuit pattern (L1) 94 having the function of the micro-strip line having a continuous shape of one of a spiral, a meander, and a curve on a first major surface and the second circuit pattern (L2) 95 having the function of the micro-strip line having a continuous shape of one of a spiral, a meander, and a curve on a second major surface are electrically connected to each other via the through via 8. Thus the first and second combined circuit patterns form an inductance (L) component, and the area of the first circuit pattern (L1) 94 on the first major surface can be reduced by optimizing first and second inductance components, thereby reducing the size and manufacturing cost of the semiconductor device.

For example, in the case where a third circuit pattern (L3) is formed at a different position on the first major surface and a fourth circuit pattern (L4) is formed at a different position on the second major surface in a similar manner to the first circuit pattern (L1) 94 formed on the first major surface and the second circuit pattern (L2) 95 formed on the second major surface, the first circuit pattern (L1) 94 formed on the first major surface and the second circuit pattern (L2) 95 formed on the second major surface are connected to each other via the through via, the third circuit pattern (L3) formed at the different position on the first major surface and the second circuit pattern (L2) 95 formed on the second major surface are connected to each other via the through via, and the fourth circuit pattern (L4) formed at the different position on the second major surface and the third circuit pattern (L3) formed at the different position on the first major surface are connected to each other via the through via, so that the circuit patterns on the first major surface and the second major surface can be extended as a single circuit pattern through the through via. Thus it is possible to easily form a large inductance which cannot be formed on one surface in the prior art, without increasing the size of the semiconductor device.

Sixth Embodiment

The following will describe a semiconductor device according to a sixth embodiment of the present invention.

Figure 14:
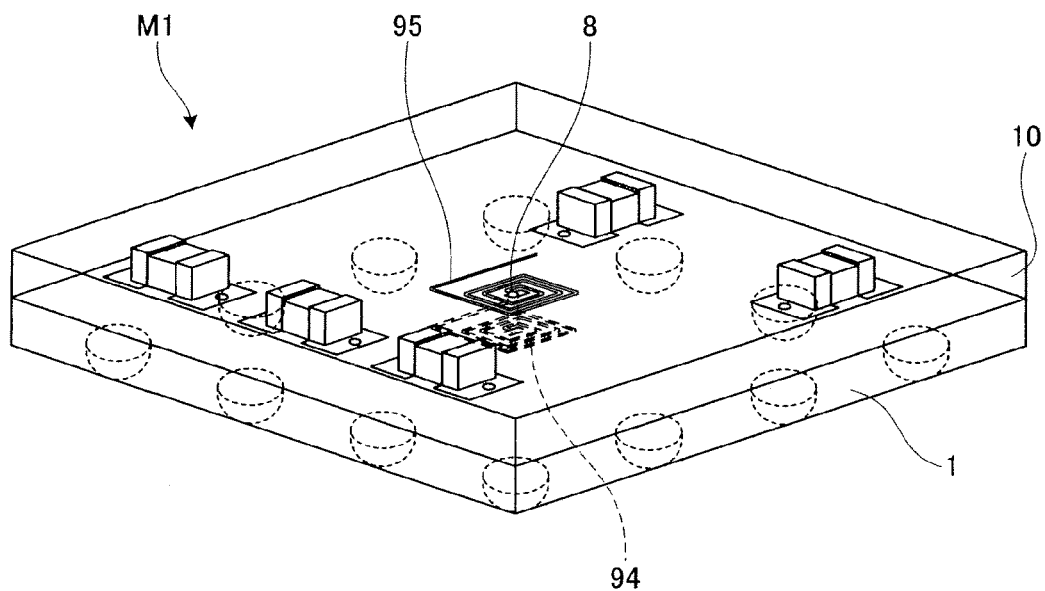
FIG. 14 is a perspective view showing the internal configuration of a semiconductor device according to a sixth embodiment of the present invention.
Figure 15:
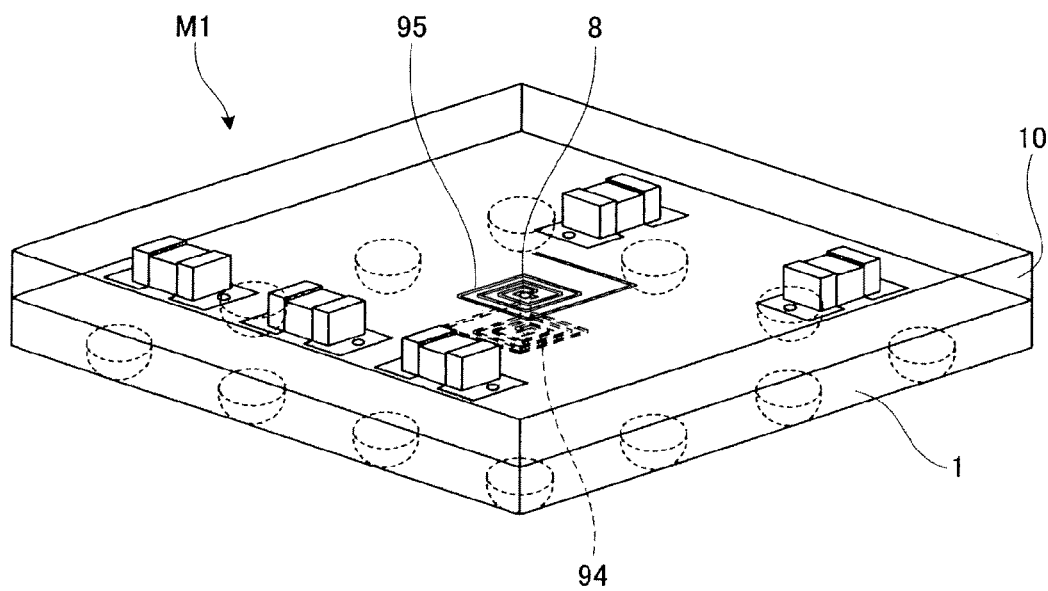
FIG. 15 is a perspective view showing another internal configuration of the semiconductor device according to the sixth embodiment of the present invention.
Figure 16:
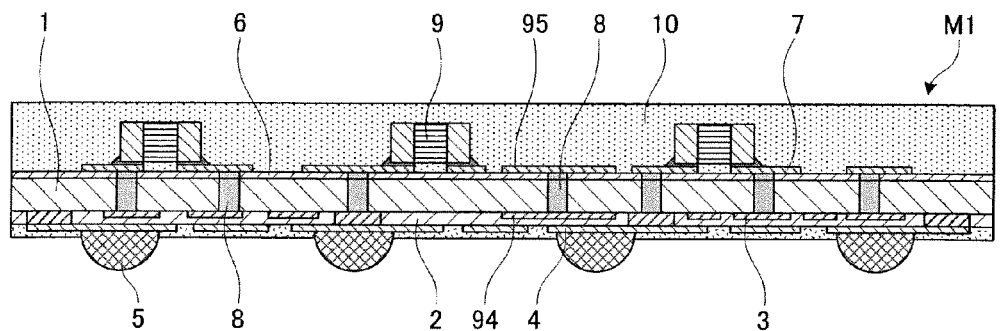
FIG. 16 is a sectional view showing the internal configuration of the semiconductor device according to the sixth embodiment of the present invention.

FIGS. 14, 15, and 16 are perspective views and a sectional view showing the configuration of the semiconductor device according to the sixth embodiment. The semiconductor device composes the power amplifier module M1 shown in FIG. 10. The semiconductor device (power amplifier module M1) is 5 mm high by 2.5 mm wide and is 1.1 mm thick.

In FIGS. 14, 15 and 16, a substrate 1 is a GaAs wafer. On the wafer surface layer (the lower part of FIG. 14) of the substrate 1, a semiconductor element made up of a power amplifier circuit pattern is formed as a circuit pattern. In the power amplifier circuit, a first circuit pattern (L1) 94 is formed which is made up of a micro-strip line having a continuous shape of one of a spiral, a meander, and a curve and has an inductance function.

FIGS. 14, 15 and 16 show continuous spirals which are wound four times with pattern width/spacing=10 μm/10μm and are 0.2 mm in diameter. The GaAs substrate 1 is 0.25 mm thick. On the power amplifier circuit, a first insulating layer 2 is formed which is made of epoxy resin and is 100 μm thick. Further, copper rewiring 4 and solder electrodes 5 for external connection are formed on the first insulating layer 2. At the center of the spiral, a through via is formed in the GaAs substrate 1 and is connected to the first spiral circuit pattern (L1) 94.

Further, on the backside (second major surface) of the GaAs substrate 1, a second insulating layer 6 is formed which is made of epoxy resin and is 100 μm thick. Moreover, a second circuit pattern (L2) 95 is formed thereon by the copper rewiring such that the second circuit pattern (L2) 95 is shaped like a continuous spiral having the same area as the spiral of the first circuit pattern (L1) 94. The second circuit pattern (L2) 95 shaped like a continuous spiral is formed at the opposite position from the first spiral circuit pattern with the GaAs substrate 1 disposed between the circuit patterns, and the second circuit pattern (L2) 95 is connected, at the pattern end of the second circuit pattern (L2) 95, to the circuit pattern extending from the through via provided in the GaAs substrate 1.

In the example of FIG. 14, the first spiral circuit pattern (L1) 94 and the second spiral circuit pattern (L2) 95 are both wound from the outside in a counterclockwise direction and thus electrical signals travel in the same direction. In the example of FIG. 15, the second spiral circuit pattern (L2) 95 is wound from the outside in a clockwise direction and thus the electrical signal travels in the opposite direction from the electrical signal of the first spiral circuit pattern (L1) 94 wound from the outside in the counterclockwise direction.

In the present embodiment, the first circuit pattern (L1) 94 and the second circuit pattern (L2) 95 are illustrated as continuous spirals. The same effect can be obtained by, for example, an inductance formed by a micro-strip line shaped like one of a meander and a curve.

According to the present embodiment, the first circuit pattern (L1) 94 and the second circuit pattern (L2) 95 are electrically connected to each other via the through via at the shortest distance. The first circuit pattern (L1) 94 has the function of the micro-strip line having a continuous shape of one of a spiral, a meander, and a curve on a first major surface, and the second circuit pattern (L2) 95 is formed at the opposite position on a second major surface from the first circuit pattern (L1) 94 with the substrate 1 disposed between the circuit patterns, and has the function of the micro-strip line having a continuous shape of one of a spiral, a meander, and a curve. With this configuration, the first and second combined circuit patterns form an inductance (L) component with high accuracy, and the area of the first circuit pattern (L1) 94 on the first major surface can be reduced by optimizing first and second inductance components, thereby reducing the size and manufacturing cost of the semiconductor device.

The first spiral circuit pattern (L1) 94 and the second spiral circuit pattern (L2) 95 are wound in the same direction or in the opposite directions. Thus when the circuit patterns are wound in the same direction and the signals travel in the same direction, the directions of magnetic fields are aligned and combined to obtain a great inductance effect. On the other hand, when the circuit patterns are wound in the opposite directions and the signals travel in the opposite directions, the isolations of the circuit patterns are increased and the circuit patterns can be caused to act as separate high-frequency elements.

For example, when using this configuration for (L1) 94 and (L2) 95 of FIG. 10, the design of an impedance from point A varies with the spiral direction. Thus a desired impedance can be obtained by using one of the circuit patterns, increasing the flexibility of design for obtaining the desired impedance.

Seventh Embodiment

The following will describe a semiconductor device according to a seventh embodiment of the present invention.

Figure 17:
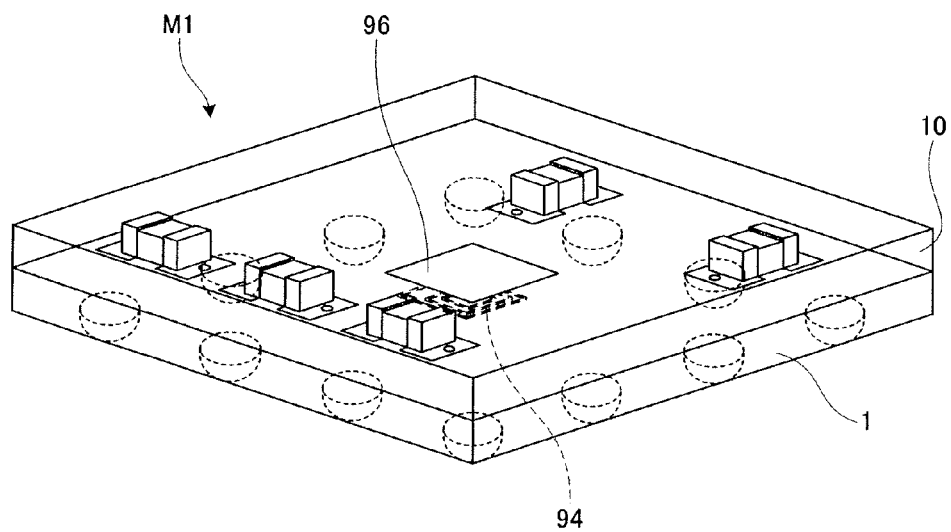
FIG. 17 is a perspective view showing the internal configuration of a semiconductor device according to a seventh embodiment of the present invention.
Figure 18:
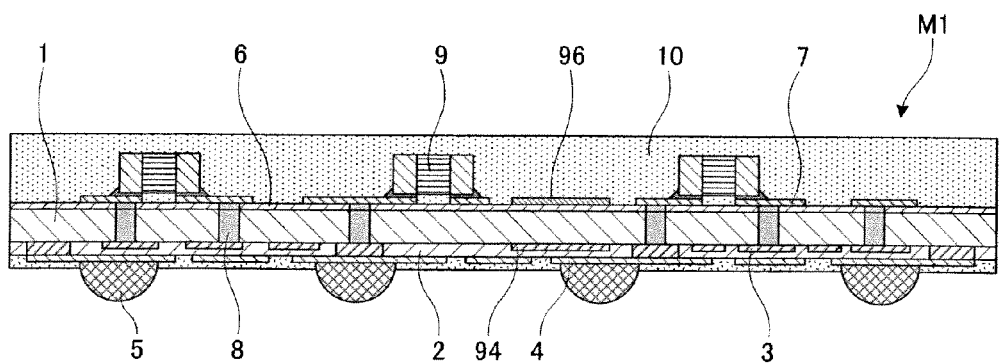
FIG. 18 is a sectional view showing the internal configuration of the semiconductor device according to the seventh embodiment.

FIGS. 17 and 18 are a perspective view and a sectional view showing the configuration of the semiconductor device according to the seventh embodiment. The semiconductor device composes the power amplifier module M1 shown in FIG. 10. The semiconductor device (power amplifier module M1) is 5 mm high by 2.5 mm wide and is 1.1 mm thick.

In FIGS. 17 and 18, a substrate 1 is a GaAs wafer. On the wafer surface layer (the lower part of FIG. 17) of the substrate 1, a semiconductor element made up of a power amplifier circuit pattern is formed as a circuit pattern. In the power amplifier circuit, a first circuit pattern (L1) 94 is formed which is made up of a micro-strip line having a continuous shape of one of a spiral, a meander, and a curve and has an inductance function. FIGS. 17 and 18 show a continuous spiral which is wound four times with pattern width/spacing=10 μm/10 μm and is 0.2 mm in diameter.

Further, a second land pattern (G1) 96 is formed at an opposite position from the first spiral circuit pattern (L1) 94 with the GaAs substrate 1 disposed between the patterns. Although the second land pattern (G1) 96 may have any size, a larger area than the first circuit pattern (L1) 94 is more desirable to obtain isolation from the first circuit pattern (L1) 94.

The second land pattern (G1) 96 has a diameter of 0.3 mm and is connected to the ground potential of the circuit pattern on a first major surface via a through via 8 of the substrate 1.

According to the present embodiment, the first circuit pattern (L1) 94 is formed which has the function of the micro-strip line having a continuous shape of one of a spiral, a meander, and a curve on the first major surface, the second land pattern (G1) 96 is formed at the opposite position from the first circuit pattern (L1) 94 with the substrate 1 disposed between the patterns, and the second land pattern (G1) 96 is connected to the ground potential of the circuit pattern on the first major surface via the through via 8 of the substrate 1. With this configuration, the surface where the first circuit pattern (L1) 94 is formed and the surface where the second land pattern (G1) 96 is formed can be isolated from each other, thereby achieving an effective solution to undesired oscillation (including self oscillation and parasitic oscillation).

The first circuit pattern (L1) 94 is formed which has the function of the micro-strip line having a continuous shape of one of a spiral, a meander, and a curve on the first major surface, the second land pattern (G1) 96 is formed at the opposite position from the first circuit pattern (L1) 94 with the substrate 1 disposed between the patterns and has an area as large as or larger than the first circuit pattern (L1) 94, and the second land pattern (G1) 96 is connected to the ground potential of the circuit pattern on the first major surface via the through via 8 of the substrate 1. With this configuration, the isolations of the patterns can be maximized by optimizing the area of the second land pattern (G1) 96, thereby achieving an effective solution to undesired oscillation (including self oscillation and parasitic oscillation).

Since the substrate 1 is a silicon wafer or a GaAs (gallium arsenide) wafer, the substrate has a high dielectric constant of at least 10 and the length of the micro-strip line can be shortened in a high-frequency region, thereby easily reducing the size and manufacturing cost of the semiconductor device.

The embodiments of the present invention have been described with reference to the specific examples. The present invention is not limited to the specific examples of the embodiments and the scope of the present invention includes all semiconductor devices, each including a first circuit pattern formed on the first major surface of a substrate, a first insulating layer formed on the circuit pattern, solder electrodes formed for external connection on the insulating layer, a second insulating layer formed on a second major surface on the opposite side of the substrate, a second circuit pattern formed on the second insulating layer, and through vias formed to connect the first circuit pattern and the second circuit pattern, wherein chip passive components are placed on the second circuit pattern and the second major surface is integrally molded with resin such that the resin covers the chip passive components, and the scope of the present invention further includes methods of manufacturing the semiconductor devices.

What is claimed is:

1. A semiconductor device, comprising:
a semiconductor substrate;
a first circuit pattern on a first major surface of the semiconductor substrate;
a second circuit pattern on a second major surface on an opposite side of the semiconductor substrate from the first major surface, and in opposed position to the first circuit pattern;
vias through the semiconductor substrate, connecting the first circuit pattern and the second circuit pattern connecting the circuit patterns;
electrodes for external connection on the first circuit pattern; and
passive chip components on the second circuit pattern on the second major surface of the semiconductor substrate, wherein the second major surface is integrally molded with resin that covers the passive chip components,
the first circuit pattern and the second circuit pattern each constituting a micro-strip line having a continuous shape of one of a spiral, a meander, and a curve, and at least ends of the first and second circuit patterns are electrically connected to each other through a via.

2. The semiconductor device according to claim 1, wherein the semiconductor substrate is one of a silicon wafer and a GaAs (gallium arsenide) wafer.

3. The semiconductor device according to claim 2, wherein the passive chip components are connected to the second circuit pattern by one of a solder material and a conductive adhesive, the solder material being selected from Sn—Pb and Sn solder materials, and the conductive adhesive containing metallic powder selected from Ag powder and Cu powder.

4. The semiconductor device according to claim 1, wherein the first major surface is integrally molded with resin partially exposing the electrodes.

5. The semiconductor device according to claim 4, wherein the semiconductor substrate is one of a silicon wafer and a GaAs (gallium arsenide) wafer.

6. The semiconductor device according to claim 5, wherein the passive chip components are connected to the second circuit pattern by one of a solder material and a conductive adhesive, and the solder material being selected from Sn—Pb and Sn solder materials, the conductive adhesive containing metallic powder selected from Ag powder and Cu powder.

7. A semiconductor device, comprising:
a semiconductor substrate;
a first circuit pattern on a first major surface of the semiconductor substrate;
a second circuit pattern on a second major surface on an opposite side of the semiconductor substrate from the first major surface;
through vias between the first circuit pattern and the second circuit pattern connecting the circuit patterns through the semiconductor substrate;
electrodes for external connection on the first circuit pattern;
passive chip components on the second circuit pattern on the second major surface of the semiconductor substrate; and
metallic spacers on the second circuit pattern,
wherein the second major surface is integrally molded with resin that covers the passive chip components,
leaving only surfaces of the metallic spacers exposed.

8. The semiconductor device according to claim 7, wherein the semiconductor substrate is one of a silicon wafer and a GaAs (gallium arsenide) wafer.

9. The semiconductor device according to claim 8, wherein the passive chip components are connected to the second circuit pattern by one of a solder material and a conductive adhesive, the solder material being selected from Sn—Pb and Sn solder materials, and the conductive adhesive containing metallic powder selected from Ag powder and Cu powder.

10. The semiconductor device according to claim 7, wherein the metallic spacers are copper blocks, and heat generated on the semiconductor substrate is dissipated also from the metal thin film formed on the resin molding surface, through the copper blocks.

11. The semiconductor device according to claim 1, wherein the first circuit pattern and the second circuit pattern are connected so that electric signals on the circuit patterns may travel in the same direction or in opposite directions with the semiconductor substrate between the circuit patterns.

12. A semiconductor device, comprising:
a semiconductor substrate;
a first circuit pattern on a first major surface of the semiconductor substrate;
a second circuit pattern on a second major surface on an opposite side of the semiconductor substrate from the first major surface;
through vias between the first circuit pattern and the second circuit pattern connecting the circuit patterns through the semiconductor substrate;
electrodes for external connection on the first circuit pattern; and
passive chip components on the second circuit pattern on the second major surface of the semiconductor substrate,
wherein the second major surface is integrally molded with resin that covers the passive chip components,
the first circuit pattern comprises a micro-strip line having a continuous shape of one of a spiral, a meander, and a curve,
the semiconductor device further comprises a second land pattern at an opposite position from the first circuit pattern with the semiconductor substrate between the patterns, and
the second land pattern is electrically connected to a ground potential of the first major surface by a through via.

13. The semiconductor device according to claim 12, wherein the second land pattern has one of a given area and an area as large as a pattern area of the first circuit pattern.

14. The semiconductor device according to claim 12, wherein the semiconductor substrate is one of a silicon wafer and a GaAs (gallium arsenide) wafer.

15. The semiconductor device according to claim 1, wherein the semiconductor substrate has a single-layer structure of a thin plate.

16. The semiconductor device according to claim 1, wherein the electrodes are solder.

17. The semiconductor device according to claim 7, further comprising
a thin metal film on a resin molding surface on the second major surface.

* * * * *